(12) United States Patent
Lee et al.

(10) Patent No.: US 10,662,511 B2
(45) Date of Patent: May 26, 2020

(54) NITRIDE SEMICONDUCTOR LIGHT-EMITTING DEVICE, AND METHOD FOR MANUFACTURING SAME

(71) Applicant: KOREA PHOTONICS TECHNOLOGY INSTITUTE, Gwangju (KR)

(72) Inventors: Seung-Jae Lee, Gwangju (KR); Sung-Chul Choi, Gwangju (KR); Jong-Hyeob Baek, Daejeon (KR); Seong-Ran Jeon, Gwangju (KR); Sang-Mook Kim, Gwangju (KR); Tae Hoon Chung, Gwangju (KR)

(73) Assignee: KOREA PHOTONICS TECHNOLOGY INSTITUTE, Gwangju (KR)

( * ) Notice: Subject to any disclaimer, the term of this patent is extended or adjusted under 35 U.S.C. 154(b) by 0 days.

(21) Appl. No.: 15/563,468

(22) PCT Filed: Jun. 30, 2015

(86) PCT No.: PCT/KR2015/006689
§ 371 (c)(1),
(2) Date: Sep. 29, 2017

(87) PCT Pub. No.: WO2016/163595
PCT Pub. Date: Oct. 13, 2016

(65) Prior Publication Data
US 2018/0069153 A1    Mar. 8, 2018

(30) Foreign Application Priority Data

Apr. 8, 2015 (KR) .......... 10-2015-0049824
Apr. 30, 2015 (KR) .......... 10-2015-0061242

(51) Int. Cl.
*H01L 33/32* (2010.01)
*H01L 33/00* (2010.01)
(Continued)

(52) U.S. Cl.
CPC .......... *C22C 38/04* (2013.01); *H01L 33/0075* (2013.01); *H01L 33/22* (2013.01); *H01L 33/32* (2013.01)

(58) Field of Classification Search
CPC ... H01L 33/24; H01L 33/0075; H01L 33/325; H01L 33/42; H01L 33/32; H01L 33/06; H01L 33/22
See application file for complete search history.

(56) References Cited

U.S. PATENT DOCUMENTS 5,604,764 A * 2/1997 Motoda .................. H01S 5/227
372/45.01
2010/0155704 A1    6/2010 Oh et al.
(Continued)

FOREIGN PATENT DOCUMENTS

JP    2007-081416 A    3/2007
JP    2008-218746 A    9/2008
(Continued)

OTHER PUBLICATIONS

Kayo Koike et al., "Improvement of Light Extraction Efficiency and Reduction of Leakage Current in GaN-Based LED via V-Pit Formation", IEEE Photonics Technology Letters, Mar. 15, 2012, pp. 449-451, vol. 24, No. 6.
(Continued)

*Primary Examiner* — Galina G Yushina
(74) *Attorney, Agent, or Firm* — Rabin & Berdo, P.C.

(57) ABSTRACT

A nitride semiconductor light-emitting device comprises a substrate; a first conductivity type semiconductor layer formed on the substrate; a high-resistance semiconductor
(Continued)

layer formed on the first conductivity type semiconductor layer; an active layer formed on the high-resistance semiconductor layer and having multiple quantum wells; and a second conductivity type semiconductor layer formed on the active layer. A first v-pit structure is formed between the high-resistance semiconductor layer and the first conductivity type semiconductor layer, and a second v-pit structure is formed between the active layer and the second conductivity type semiconductor layer. The second v-pit structure is formed such that a lowest part of the second conductivity type semiconductor layer contacts a lowest quantum well of the multiple quantum wells of the active layer through the second v-pit structure.

3 Claims, 10 Drawing Sheets

(51) Int. Cl.
*C22C 38/04* (2006.01)
*H01L 33/22* (2010.01)

(56) References Cited

U.S. PATENT DOCUMENTS

| | | | | |
|---|---|---|---|---|
| 2011/0049552 A1* | 3/2011 | Pyeon | ............... | H01L 33/60 257/98 |
| 2011/0309327 A1* | 12/2011 | Jeong | ............... | H01L 33/025 257/13 |
| 2013/0082273 A1 | 4/2013 | Ting | | |
| 2015/0115223 A1* | 4/2015 | Kwak | ............... | H01L 21/02458 257/22 |
| 2016/0043279 A1* | 2/2016 | Jean | ............... | H01L 33/325 257/13 |

FOREIGN PATENT DOCUMENTS

| | | | |
|---|---|---|---|
| JP | 2012-156508 A | | 8/2012 |
| JP | 2014-518014 A | | 7/2014 |
| JP | 2014-518014 A | | 7/2014 |
| JP | 2014-143358 A | | 8/2014 |
| KR | 10-2010-0073702 A | | 7/2010 |
| KR | 10-1164026 B1 | | 7/2012 |
| KR | 10-2013-0061981 A | | 6/2013 |
| KR | 10-2013-0104823 A | | 9/2013 |
| KR | 10-2014-0120681 A | | 10/2014 |
| KR | 20140120681 | * 10/2014 | ........... H01L 33/025 |
| KR | 10-2014-0145368 A | | 12/2014 |
| WO | WO 2013/049415 A1 | | 4/2013 |

OTHER PUBLICATIONS

S. W. Lee et al., "Origin of forward leakage current in GaN-based light-emitting devices", Applied Physics Letters, 2006, pp. 132117-1-132117-3, vol. 89.
A. Hangleiter et al., "Suppression of Nonradiative Recombination by V-Shaped Pits in GaInN/GaN Quantum Wells Produces a Large Increase in the Light Emission Efficiency", Physical Review Letters, Sep. 16, 2005, 127402, PRL 95.
Japanese Office Action dated Sep. 4, 2018.
Chinese Office Action dated Dec. 28, 2018.

* cited by examiner (a)

(b)

NITRIDE SEMICONDUCTOR LIGHT-EMITTING DEVICE, AND METHOD FOR MANUFACTURING SAME

TECHNICAL FIELD

The present invention relates to a nitride semiconductor light-emitting device, and a method for manufacturing the same. More particularly, the present invention relates to a nitride semiconductor light-emitting device, and a method for manufacturing the same, which is configured to improve electrostatic discharge (ESD) characteristics of nitride semiconductor light-emitting devices.

BACKGROUND ART

Current leakage relates to characteristic deterioration in reliability, service life, and high-voltage operation of a device, thus it is important to manufacture a reliable device based on group III nitride light-emitting diodes.

It has been known that a group III nitride light-emitting device has bad electrostatic characteristics in comparison with light-emitting devices made of other compounds. As an example, crystal defects, which is occurred on the group III nitride semiconductor layer grown on a substrate due to a lattice mismatch between the substrate and the group III nitride semiconductor layer, spread to a growth direction of the group III nitride semiconductor layer, thereby forming a threading dislocation.

The crystal defects increase current leakage of device, and in the case of introducing an external static electricity, an active layer of the light-emitting device having many of crystal defects is broken by a strong field. Generally, it is known that crystal defects (threading dislocation) of $10^9$ to $10^{11}/cm^2$ exist on a GaN thin film.

The electrostatic destruction characteristics of the light-emitting device are very important issues related to an application range of GaN-based light-emitting devices.

Particularly, a design of device for withstanding static electricity generated from package devices and workers of the light-emitting device is very important parameter for improving the yield of a final device.

Particularly, electrostatic characteristics have become more important since the GaN-based light-emitting device is recently applied to and used in bad condition environments such as outdoor signboards, vehicle lights, etc.

Generally, an ESD of a conventional GaN light-emitting device withstands several thousand volts in a forward direction under Human Body Mode (HBM), whereas it does not withstand several hundred volts in a reverse direction. As described above, the main reason is the crystal defects of the device, and also, an electrode design of the device is very important. In particular, since a sapphire substrate is generally used in GaN light-emitting device as an insulator, the ESD characteristics are further deteriorated by intensifying a concentration phenomenon of currents around an N-electrode during a practical device operation as the N-electrode and a P-electrode are formed at the same plane on the structure of the device.

Various methods configured to improve characteristics of light-emitting device and other electronic devices by reducing density of threading dislocation defect are proposed in the related art as follows.

For instance, in Korean Patent No. 10-1164026 (registration date: 2012 Jul. 18), Korean Patent Application Publication No. 10-2013-0061981 (publication date: 2013 Jun. 12), and Korean Patent Application Publication No. 10-2014-0145368 (publication date: 2014 Dec. 23) a growth method was introduced, wherein a Hexagonal v-pit (V-shaped pit) was formed on each of threading dislocations, and when v-pits were formed on an active layer, the active layer was formed thinly on a sidewall and had high band gap so that a barrier height was increased and non-radiative recombination was minimized, therefore, an internal quantum efficiency is increased. However, the conventional techniques have a problem with reduced optical output due to a decrease in an overall light-emitting region, since the v-pit area of the active layer was excluded from a light-emitting region in such a structure.

DOCUMENTS OF RELATED ART

Patent Documents (Patent Document 1) Korean Patent No. 10-1164026 (registration date: 2012.07.18)
(Patent Document 2) Korean Patent Application Publication No. 10-2013-0061981 (publication date: 2013.06.12)
(Patent Document 3) Korean Patent Application Publication No. 10-2014-0145368 (publication date: 2014.12.23)

Non-Patent Documents

"Suppression of Nonradiative Recombination by V-Shaped Pits in GaInN/GaN Quantum Wells Produces a Large Increase in the Light Emission Efficiency"; A. Hangleiter, F. Hitzel, C. Netzel, D. Fuhrmann, U. Rossow, G. Ade, and P. Hinze; PRL 95, 127402 (2005).
"Origin of forward leakage current in GaN-based light-emitting devices"; S. W. Lee, D. C. Oh, H. Goto, H. J. Lee, T. Hanada, M. W. Cho, and T. Yao; APPLIED PHYSICS LETTERS 89, 132117 (2006).
"Improvement of Light Extraction Efficiency and Reduction of Leakage Current in GaN-Based LED via V-Pit Formation"; Kayo Koike, Seogwoo Lee, Sung Ryong Cho, Jinsub Park, Hyojong Lee, Jun-Seok Ha, Soon-Ku Hong, Hyun-Yong Lee, Meoung-Whan Cho, and Takafumi Yao; IEEE PHOTONICS TECHNOLOGY LETTERS, VOL. 24, NO. 6, Mar. 15, 2012.

DISCLOSURE

Technical Problem

Accordingly, the present invention has been made keeping in mind the above problems occurring in the related art, and an object of the present invention is to provide a nitride semiconductor light-emitting device, and a method for manufacturing the same capable of minimizing degradation of overall uniform luminosity when applying a v-pit structure to improve the reverse voltage characteristics.

Technical Solution

In order to accomplish the above object, a nitride semiconductor light-emitting device of the present invention includes: a substrate; a first conductivity type semiconductor layer formed on the substrate; a high-resistance semiconductor layer formed on the first conductivity type semiconductor layer; an active layer formed on the high-resistance semiconductor layer; and a second conductivity type semiconductor layer formed on the active layer, wherein the nitride semiconductor light-emitting device has a V-shaped (v-pit) structure at a junction surface between the high-resistance semiconductor layer and the first conductivity type semiconductor layer, and has a plane or a gradual curved plane structure at a junction surface between the high-resistance semiconductor layer and the active layer.

Desirably, the junction surface between the high-resistance semiconductor layer and the active layer is a flat surface with no v-pit structure.

Desirably, the active layer has a plane structure at a junction surface between the active layer and the second conductivity type semiconductor layer.

Next, a nitride semiconductor light-emitting device according to another embodiment of the present invention includes: a substrate; a first conductivity type semiconductor layer formed on the substrate; a high-resistance semiconductor layer formed on the first conductivity type semiconductor layer; an active layer formed on the high-resistance semiconductor layer; and a second conductivity type semiconductor layer formed on the active layer, wherein the nitride semiconductor light-emitting device has a V-shaped (v-pit) structure on each of junction surfaces between the high-resistance semiconductor layer and the first conductivity type semiconductor layer, and between the active layer and the second conductivity type semiconductor layer, and has a flat surface with no v-pit structure at a junction surface between the high-resistance semiconductor layer and the active layer. Desirably, the junction surface between the high-resistance semiconductor layer and the active layer has a plane or a gradual curved plane structure with no v-pit structure, or the second conductivity type semiconductor layer has v-pit structure.

Desirably, when the high-resistance semiconductor layer has a silicon impurity concentration of $10^{18}/cm^3$ or less, a magnesium impurity concentration of equal to or greater than $10^{16}/cm^3$, and a thickness range of 10 nm to 1000 nm.

A method for manufacturing a nitride semiconductor light-emitting device includes: a first step of growing a first conductivity type semiconductor layer on a substrate while forming a v-pit structure on an upper surface of the first conductivity type semiconductor layer; a second step of forming a high-resistance semiconductor layer on the first conductivity type semiconductor layer with a low conductivity material such that the v-pit structure of the first conductivity type semiconductor layer is flattened; and a third step of sequentially forming an active layer and a second conductivity type semiconductor layer on the flat first conductivity type semiconductor layer.

In addition, according to another embodiment of the present invention, a method for manufacturing nitride semiconductor light-emitting device includes: a first step of growing a first conductivity type semiconductor layer on a substrate while forming a v-pit structure on an upper surface of the first conductivity type semiconductor layer; a second step of forming a high-resistance semiconductor layer on the first conductivity type semiconductor layer with a low conductivity material such that the v-pit structure of the first conductivity type semiconductor layer is flattened; a third step of forming an active layer on the flat high-resistance semiconductor layer while forming a v-pit structure on an upper surface of the active layer; and a forth step of forming a second conductivity type semiconductor layer while flattening the v-pit structure of the active layer.

Desirably, after forming a first conductivity type semiconductor layer on the high-resistance semiconductor layer flattened at the third step, the active layer and the second conductivity type semiconductor layer are formed.

Advantageous Effects

As described above, the light-emitting device of the present invention is manufactured by forming a first conductivity type semiconductor layer having a v-pit structure on the upper surface of the first conductivity type semiconductor layer, flattening the first conductivity type semiconductor layer using a low conductivity material, and forming an active layer and a second conductivity type semiconductor layer, or the light-emitting device of the present invention further has a v-pit structure on a junction surface between a second conductivity type semiconductor layer and an active layer. Thus, a v-pit area has a thickness equal to or greater than a thickness of a remaining area and thus has very low conductivity, thereby preventing the flow of a current, while the remaining area has a thickness equal to or less than the thickness of the v-pit area and thus a current can flow upwards. Thus, the present invention has effects in reducing current leakage and enhancing durability of other elements while reducing non-radiative recombination generated by threading dislocation, thereby minimizing degradation of luminosity.

BEST MODE

In the following description, the structural or functional description specified to exemplary embodiments according to the concept of the present invention is intended to describe the exemplary embodiments, so it should be understood that the present invention may be variously embodied, without being limited to the exemplary embodiments. While the present invention will be described in conjunction with exemplary embodiments thereof, it is to be understood that the present description is not intended to limit the present invention to those exemplary embodiments. On the contrary, the present invention is intended to cover not only the exemplary embodiments, but also various alternatives, modifications, equivalents and other embodiments that may be included within the spirit and scope of the present invention.

Further, relative terms, such as "lower" or "bottom" and "upper" or "top" may be used herein to describe relationship of one element to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements.

The exemplary term "lower" can, therefore, encompass both an orientation of "lower" and "upper", depending upon the particular orientation of the figure. Similarly, if the device in one of the figures were turned over, elements described as "below" or "beneath" other elements would then be oriented "above" the other elements. The exemplary terms "below" or "beneath" can, therefore, encompass the orientations of both above and below.

Also, for convenience of understanding of the elements, in the figures, sizes or thicknesses may be exaggerated to be large (or thick), may be expressed to be small (or thin) or may be simplified for clarity of illustration, but due to this, the protective scope of the present invention should not be interpreted narrowly.

Hereinafter, embodiments of the present invention will be described with reference to the accompanying drawings.

First Embodiment

Figure 1A:
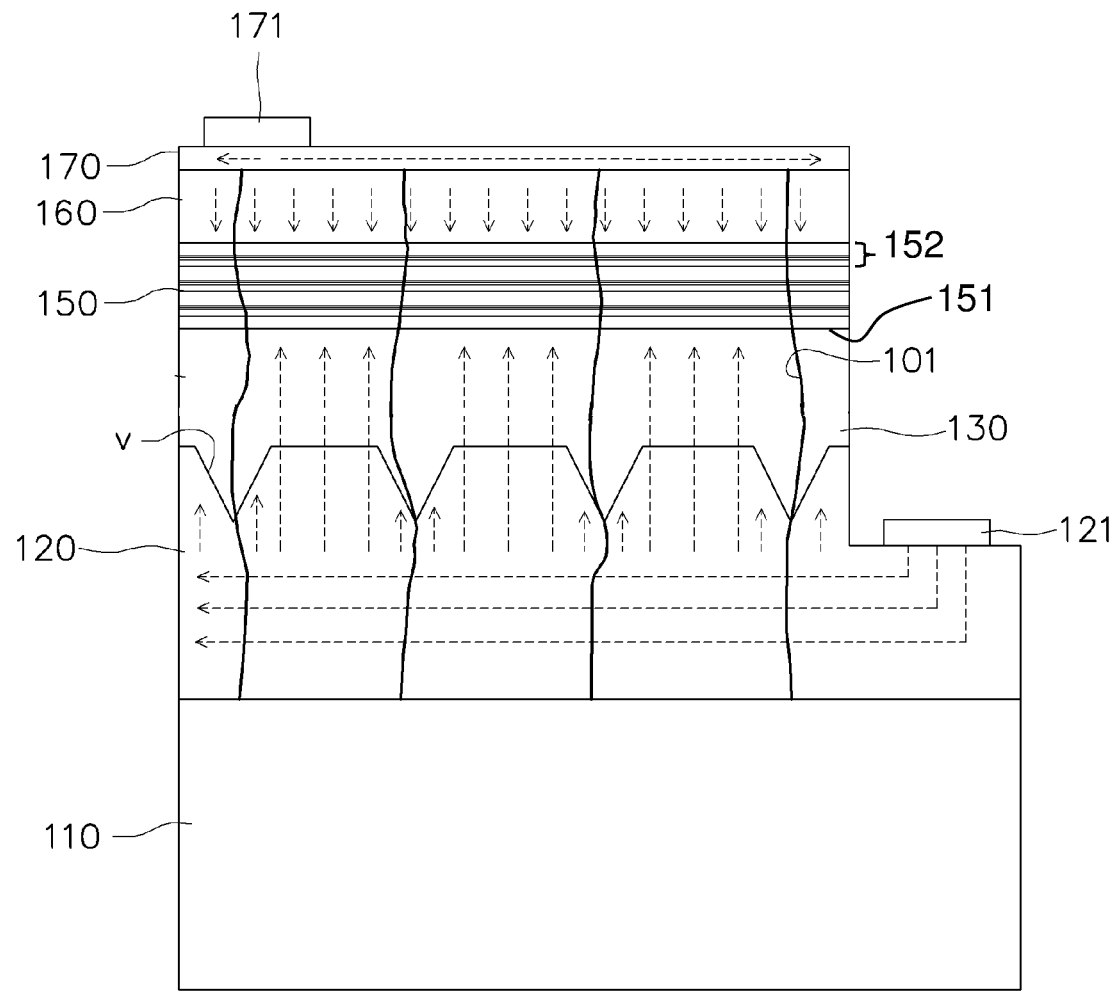
FIGS. 1A and 1B are cross sectional views showing a structure of a nitride semiconductor light-emitting device according to a first embodiment of the present invention.

FIG. 1A is a cross sectional view showing a structure of a light-emitting device according to the present invention. A light-emitting device comprises a substrate 110; a first conductivity type semiconductor layer 120 formed on the substrate 110; a high-resistance semiconductor layer 130 formed on the first conductivity type semiconductor layer 120; an active layer 150 formed on the high-resistance semiconductor layer 130; and a second conductivity type semiconductor layer 160 formed on the active layer 150, wherein the light-emitting device has a V-shaped (v-pit) structure v at a junction surface between the high-resistance semiconductor layer 130 and the first conductivity type semiconductor layer 120 and has a plane or a gradual curved plane structure at a junction surface (151) between the high-resistance semiconductor layer 130 and the active layer 150.

The substrate 110 was provided as a base layer for arranging light-emitting device, the substrate 110 may be formed by using a transparent material including sapphire substrate, also the substrate 110 may be formed by using a material such as GaN-based substrate, SiC, Si, ZnO, or the like in place of the sapphire.

The first conductivity type semiconductor layer 120 formed on the substrate 110 may be consisted of an n-type semiconductor layer providing electrons to the active layer 150, and may include n-type semiconductor layer wherein n-type impurities are doped with a material such as Si, Ge, Sn, etc. For instance, the first conductivity type semiconductor layer 120 may be formed by using a material such as GaN, AlN, AlGaN, InGaN, InN, InAlGaN, AlInN, etc.

A buffer layer (not shown) may be added between the substrate 110 and the first conductivity type semiconductor layer 120 to improve lattice matching according to a type of the substrate and a growth process of the substrate.

A partial top surface of the first conductivity type semiconductor layer 120 is exposed and an electrode 121 is formed thereto.

A transparent electrode 170 made of a material such as ITO is formed on the second conductivity type semiconductor layer 160 and a bonding electrode is formed on the transparent electrode 170.

The second conductivity type semiconductor layer 160, which is formed on the active layer 150, may be a p-type semiconductor layer injecting holes to the active layer 150, and the p-type semiconductor layer are doped with a material such as Mg, Zn, Ca, Sr, Ba, etc. For instance, the second conductivity type semiconductor layer 160 may be formed of by using a material such as GaN, AlN, AlGaN, InGaN, InN, InAlGaN, AlInN, etc.

The active layer 150 is interposed between the first conductivity type semiconductor layer 120 and the second conductivity type semiconductor layer 160, electrons and holes recombine therein, and a transition to a lower energy level occurs. As a result, the active layer 150 generates light having a corresponding wavelength.

The active layer 150 may be provided as a single- or multi-quantum-well structure (152) made of nitride semiconductor containing indium and gallium.

Figure 1B:
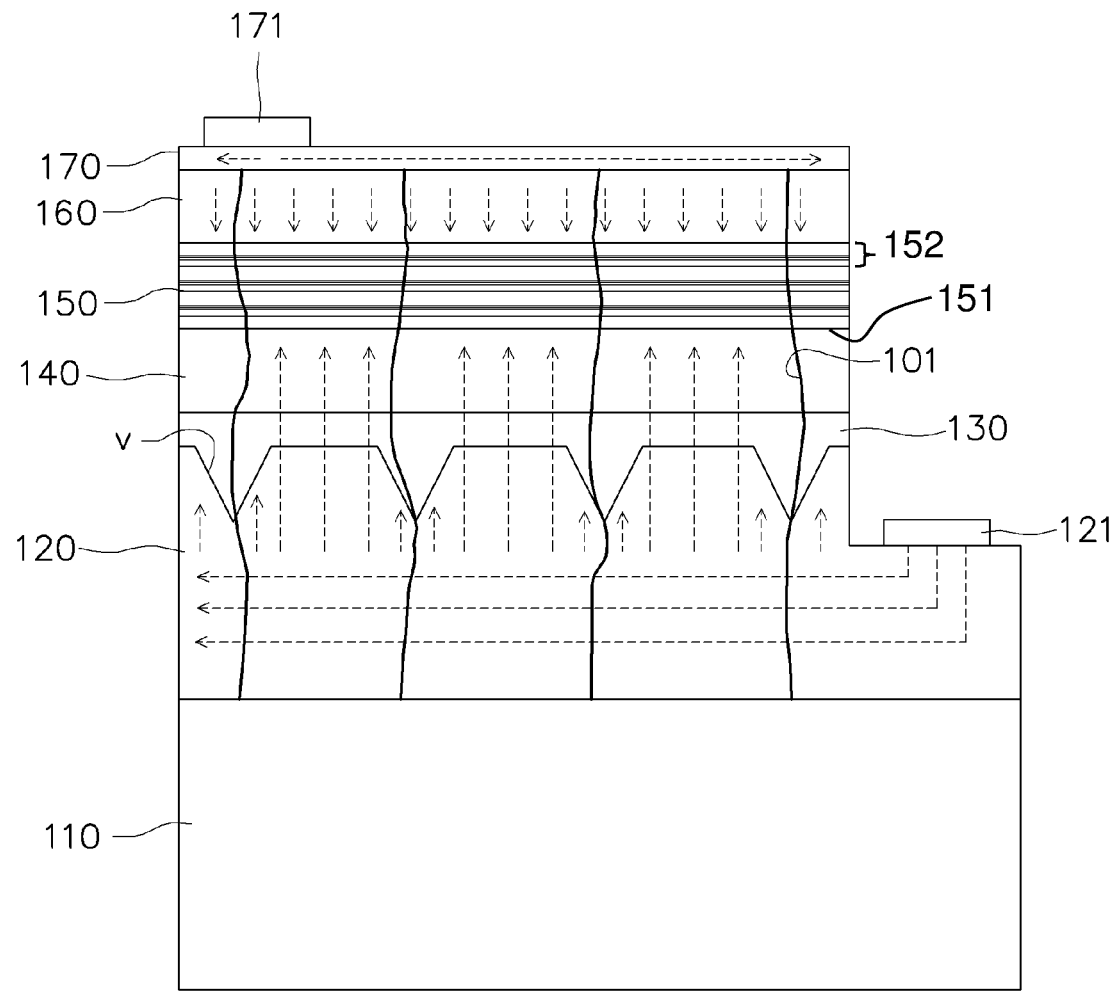
Figure 2:
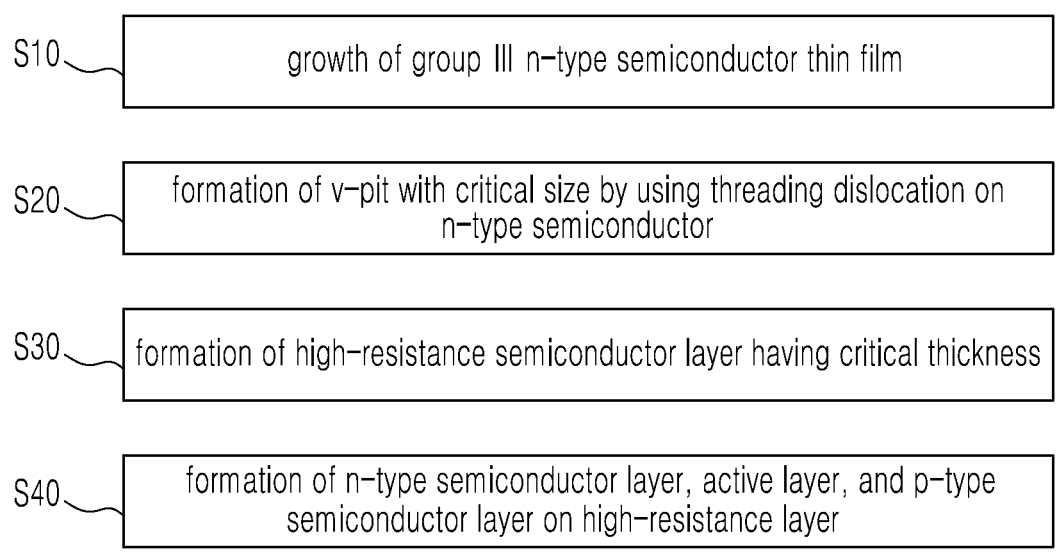
FIG. 2 is a flow diagram briefly showing a method for manufacturing a nitride light-emitting device according to the first embodiment of the present invention.
Figure 3:
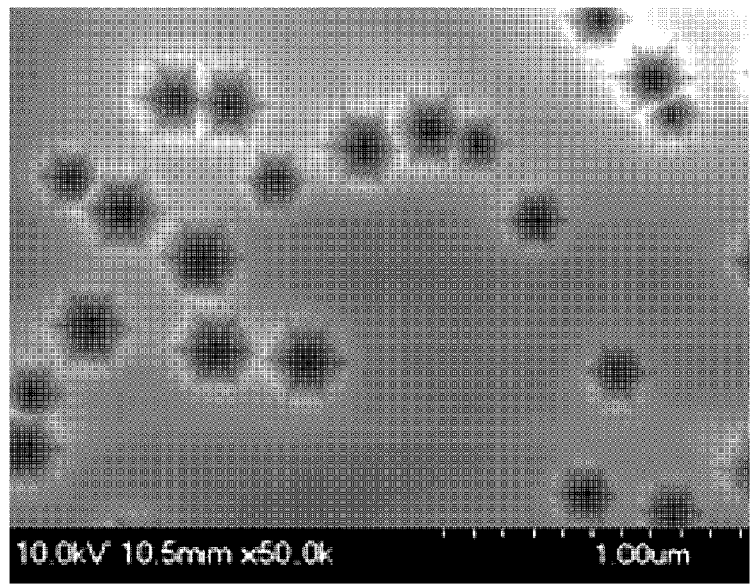
FIGS. 3a and 3b are a plan view and a perspective view illustrating SEM images showing v-pit structures on an n-type GaN layer acquired from control of growth conditions according to the first embodiment.
Figure 3:
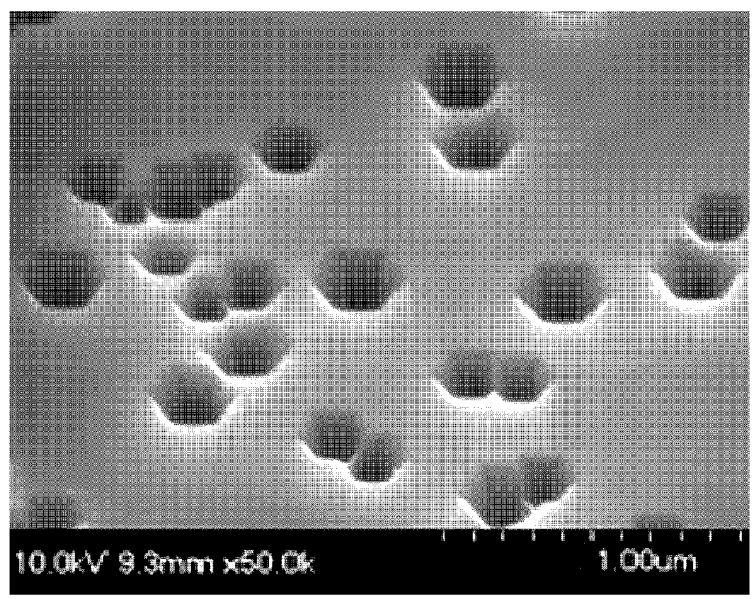

In this embodiment, a light-emitting device may have multiple first conductivity type semiconductor layers 120 and 140 as illustrated in FIG. 1B, the high-resistance semiconductor layer 130 is interposed between a lower one 120 of the first conductivity type semiconductor layers and an upper one 140 of the first conductivity type semiconductor layers. Particularly, the light-emitting device has a v-pit structure v at the junction surface between the lower first conductivity type semiconductor layer 120 and the high-resistance semiconductor layer 130, and has a plane or a gradual curved plane structure at a junction surface between the high-resistance semiconductor layer 130 and the upper first conductivity type semiconductor layer 140.

Specifically, the v-pit structure v is formed around a threading dislocation 101 penetrating a light-emitting device and prevents concentration of current to the threading dislocation 101.

The v-pit structure v may be formed by controlling lower first conductivity type semiconductor layer 120 growth conditions such as a growth temperature, a growth rate, and an atmospheric gas. After the v-pit structure v is formed on the lower first conductivity type semiconductor layer 120, the high-resistance semiconductor layer 130 is formed on the lower first conductivity type semiconductor layer 120 with relatively low conductivity material such that the v-pit structure v of the lower first conductivity type semiconductor layer 120 is flattened.

On the other hand, the junction surface between the high-resistance semiconductor layer 130 and the upper first conductivity type semiconductor layer 140 is a plane structure. At this point, in the present invention, the 'plane' structure is not strictly limited to a plane defined mathematically, and it should be understood the plane includes the gradual curved plane structure in a range of not having a V-shaped (v-pit) structure.

The high-resistance semiconductor layer 130 may be provided by an n-type resultant semiconductor layer or an unintentionally doped semiconductor layer not arbitrary doped. A thickness range of the high-resistance semiconductor layer 130 is desirably within a range of 10 nm to 1000 nm.

Further, in this embodiment, after the upper first conductivity type semiconductor layer 140 is thinly formed on the high-resistance semiconductor layer 130, the active layer 150 and the second conductivity type semiconductor layer 160 are formed thereon.

In this way, a remaining area excluding a v-pit area has a thickness equal to or less than the thickness of the v-pit area and thus a current may flow to the second conductivity type semiconductor layer 160, while the v-pit area has a thickness equal to or greater than the thickness of the remaining area and thus has very low conductivity, thereby preventing the flow of a current. That is, the current generally concentrated through a threading dislocation is covered with the low conductivity material and is prevented, thus the present invention is capable of reducing current leakage, enhancing durability of other elements, and reducing non-radiative recombination generated by the threading dislocation, thereby minimizing degradation of luminosity.

On the other hand, the high-resistance semiconductor layer 130 has low conductivity and this improves the transverse current spreading, thus overall uniform light-emitting characteristics of a light-emitting area and the reverse voltage characteristics can be improved.

On the other hand, this embodiment is given the first conductivity type semiconductor layer 120 and 140, which is a multiple layer structure, but also it may be a single layer structure wherein the active layer 150 is formed directly on the high-resistance semiconductor layer 130 as illustrated in FIG. 1A and the junction surface between the high-resistance semiconductor layer 130 and the active layer 150 is a plane structure.

FIGS. 4a and 4b are graphs showing light-emitting characteristics according to a wavelength of a light-emitting device according to the first embodiment of the present invention (dotted line) in comparison with a conventional technique (solid line), wherein FIG. 4a shows a PL spectrum, and FIG. 4b shows an EL spectrum of the device.

Figure 4:
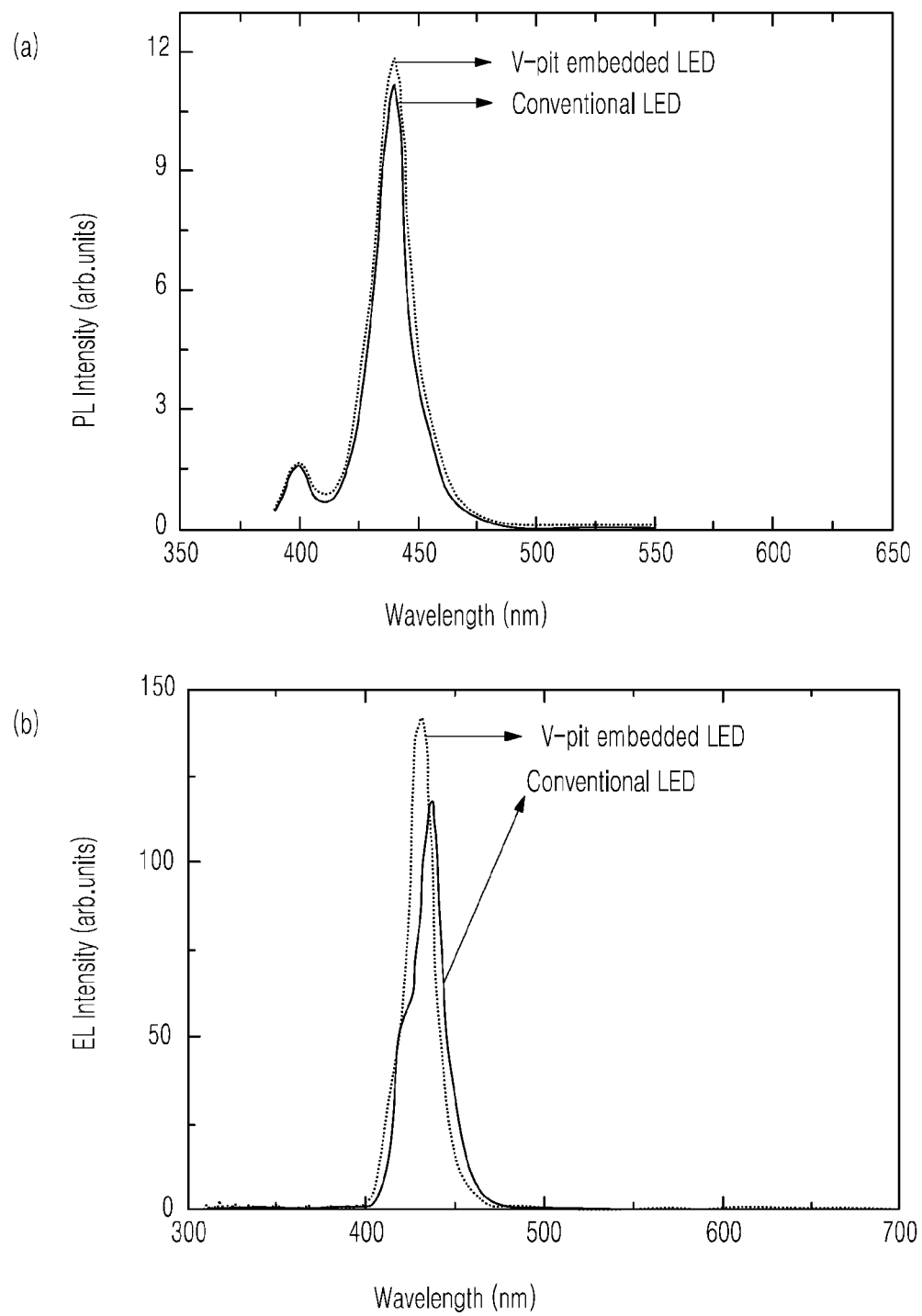
FIGS. 4a and 4b are graphs showing light-emitting characteristics according to a wavelength of a light-emitting device according to the first embodiment of the present invention in comparison with a conventional technique.

As illustrated in FIG. 4, the light-emitting device of the present invention was improved in comparison with conventional technique in the PL spectrum and the EL spectrum.

Second Embodiment

Figure 5:
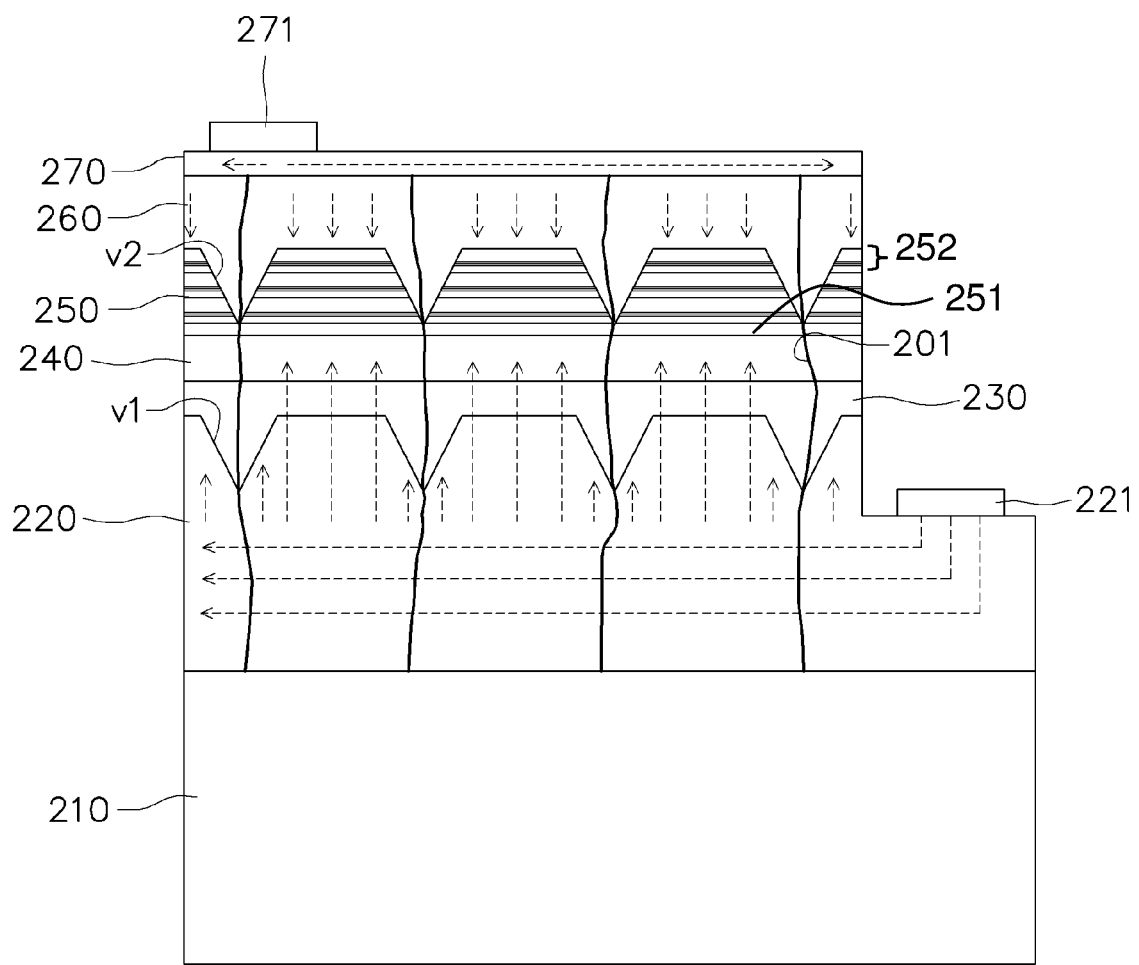
FIG. 5 is a cross sectional view showing a structure of a nitride light-emitting device according to a second embodiment of the present invention.
Figure 6:
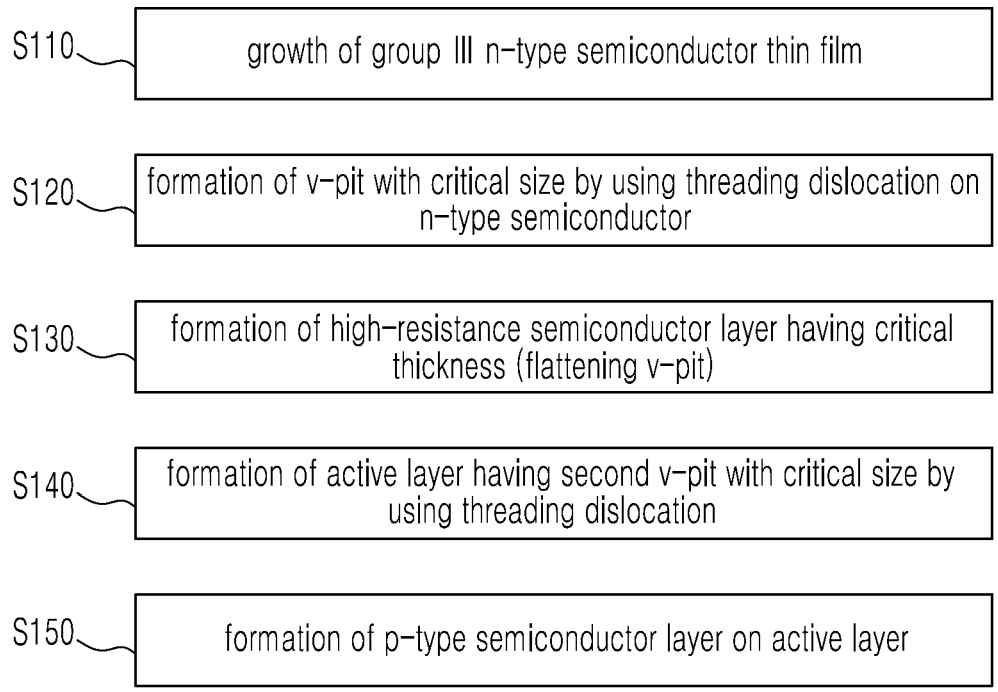
FIG. 6 is a flow diagram briefly showing a method for manufacturing a nitride light-emitting device according to the second embodiment of the present invention.
Figure 7:
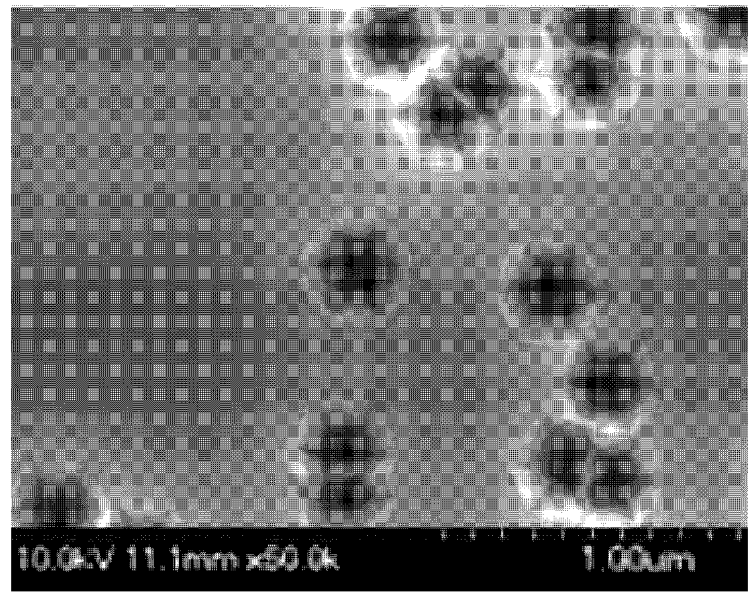
FIGS. 7a and 7b are a plan view and a perspective view illustrating SEM images showing v-pit structures on an n-type GaN layer acquired from control of growth conditions according to the second embodiment.
Figure 7:
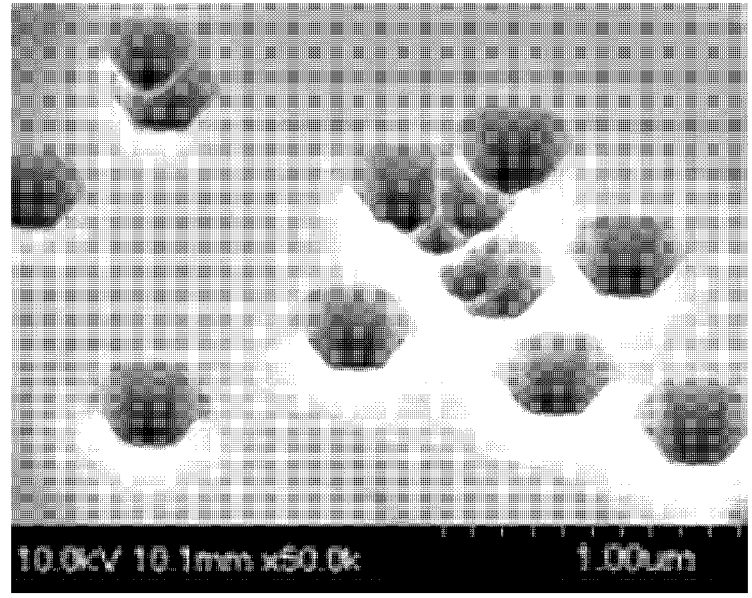
Figure 8:
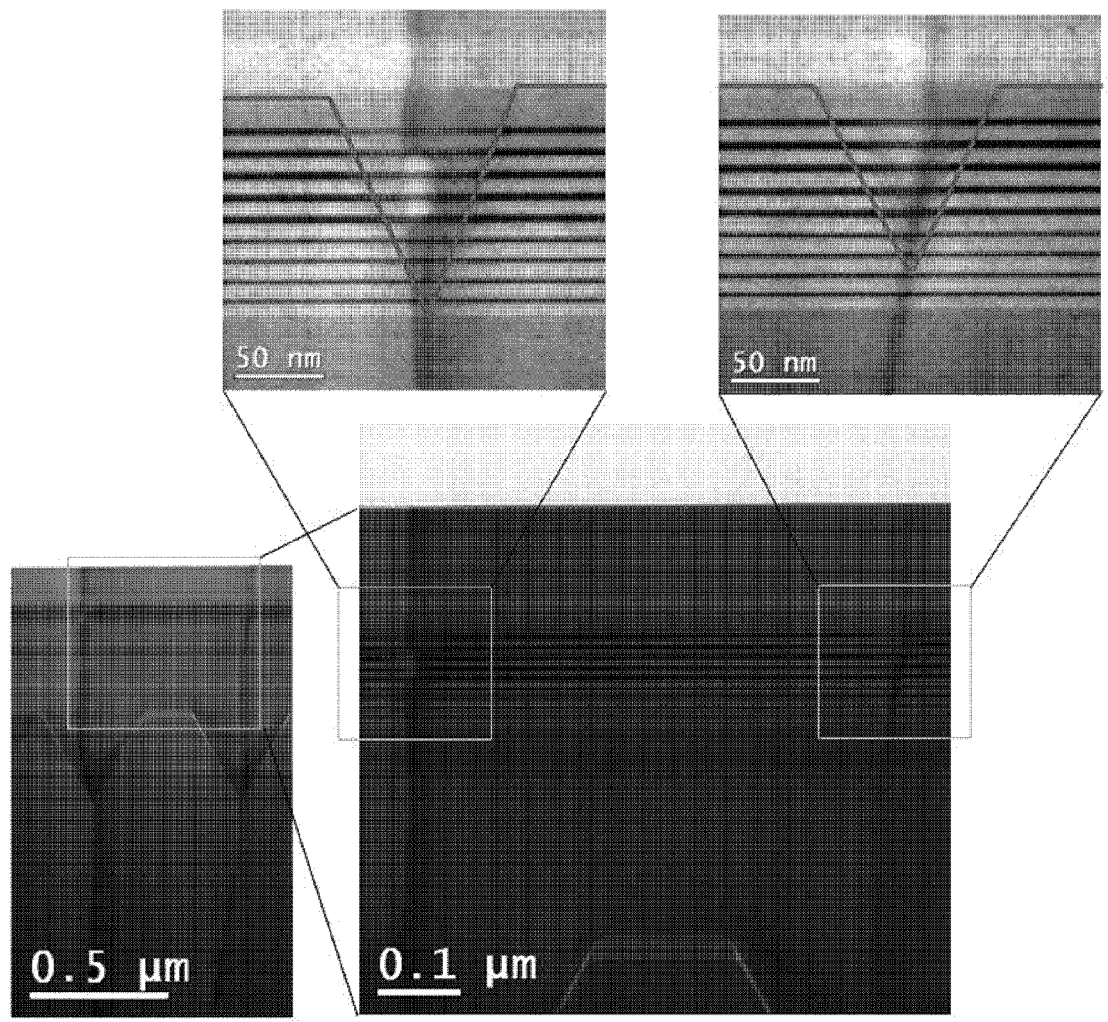
FIG. 8 is cross sectional TEM images showing V-pit structure formed on active layer.

FIG. 5 is a cross sectional view showing a structure of a light-emitting device according to the present invention. A light-emitting device comprises: a substrate 210; a first conductivity type semiconductor layer 220 formed on the substrate 210; a high-resistance semiconductor layer 230 formed on the first conductivity type semiconductor layer 220; an active layer 250 formed on the high-resistance semiconductor layer 230; and a second conductivity type semiconductor layer 260 formed on the active layer 250, wherein the light-emitting device has a V-shaped (v-pit) structure v1, v2 on each of junction surfaces between the high-resistance semiconductor layer 230 and the first conductivity type semiconductor layer 220 and between the active layer 250 and the second conductivity type semiconductor layer 260, and has a flat surface with no v-pit structure at a junction surface (251) between the high-resistance semiconductor layer 230 and the active layer 250 in case that a layer 240 is not exist in FIG. 5.

The substrate 210 is provided as a base layer for arranging light-emitting device, the substrate 210 may be formed by using a transparent material including sapphire substrate, also the substrate 210 may be formed by using a material such as a GaN-based substrate, SiC, Si, ZnO, or the like in place of the sapphire.

The first conductivity type semiconductor layer 220 formed on the substrate 210 may consist of an n-type semiconductor layer providing electrons to the active layer 250, and may include an n-type semiconductor layer wherein n-type impurities are doped with a material such as Si, Ge, Sn, etc. For instance, the first conductivity type semiconductor layer 220 may be formed by using a material such as GaN, AlN, AlGaN, InGaN, InN, InAlGaN, AlInN, etc.

A buffer layer (not shown) may be added between the substrate 210 and the first conductivity type semiconductor layer 220 to improve lattice matching according to a type of the substrate and a growth process of the substrate.

A partial top surface of the first conductivity type semiconductor layer 220 is exposed and an electrode 221 is formed thereon.

A transparent electrode 270 made of a material such as ITO is formed on the second conductivity type semiconductor layer 260 and a bonding electrode is formed on the transparent electrode 270.

The second conductivity type semiconductor layer 260 formed on the active layer 250 may be a p-type semiconductor layer injecting holes to the active layer 250, and the p-type semiconductor layer are doped with a material such as Mg, Zn, Ca, Sr, Ba, etc. For instance, the second conductivity type semiconductor layer 260 may be formed by using a material such as GaN, AlN, AlGaN, InGaN, InN, InAlGaN, AlInN, etc.

The active layer 250 is interposed between the first conductivity type semiconductor layer 220 and the second conductive semiconductor layer 260, electrons and holes recombine therein, and a transition to a lower energy level occurs. As a result, the active layer 250 generates light having a corresponding wavelength.

The active layer 250 may be provided as a single- or multi-quantum-well structure (252) made of nitride semiconductor containing indium and gallium.

In this embodiment, a light-emitting device may have multiple first conductivity type semiconductor layers 220 and 240, and the high-resistance semiconductor layer 230 is interposed between a lower one 220 of the first conductivity type semiconductor layers and an upper one 240 of the first conductivity type semiconductor layers.

Particularly, in this embodiment, the light-emitting device has a V-shaped (v-pit) structure v1, v2 individually at each of junction surfaces between the lower first conductivity type semiconductor layer 220 and the high-resistance semiconductor layer 230, and between the active layer 250 and the second conductivity type semiconductor layer 260.

Desirably, the junction surface between the high-resistance semiconductor layer 230 and the upper first conductivity type semiconductor layer 240 has a plane or a gradual curved plane structure.

Specifically, the v-pit structure v1, v2 is formed around a threading dislocation 201 penetrating a light-emitting device and prevent concentration of current to the threading dislocation 201.

In this embodiment, a first v-pit structure v1 may be formed by controlling lower first conductivity type semiconductor layer 220 growth conditions such as a growth temperature, a growth rate, and an atmospheric gas. After the v-pit structure v1 is formed on the lower first conductivity type semiconductor layer 220, the high-resistance semiconductor layer 230 is formed on the lower first conductivity type semiconductor layer 220 with relatively low conductivity material such that the v-pit structure v1 of the lower first conductive semiconductor layer 220 is flattened. A second v-pit structure v2 may be formed on the active layer 250 according to the same process.

Desirably, a depth of the second v-pit structure v2 may be decided in a range of 100 Å to 1 μm.

On the other hand, the junction surface between the high-resistance semiconductor layer 230 and the upper first conductivity type semiconductor layer 240 is a plane structure. At this point, in the present invention, the 'plane' structure is not strictly limited to plane defined mathematically, and it should be understood the plane includes the gradual curved plane structure in a range of not having a V-shaped (v-pit) structure.

The high-resistance semiconductor layer 230 may be provided by an n-type resultant semiconductor layer or an unintentionally doped semiconductor layer not arbitrary doped. A thickness range of the high-resistance semiconductor layer 230 is desirably within a range of 10 nm to 1000 nm.

Further, in this embodiment, after the upper first conductivity type semiconductor layer is 240 thinly formed on the high-resistance semiconductor layer 230, the active layer 250 and the second conductivity type semiconductor layer 260 are formed thereon.

In this way, a remaining area excluding a v-pit area has a thickness equal to or less than the thickness of the v-pit area and thus a current may flow to the second conductivity type semiconductor layer 260, while the v-pit area has a thickness equal to or greater than the thickness of the remaining area and thus has very low conductivity, thereby preventing the flow of a current.

That is, the current generally concentrated through a threading dislocation is covered with the low conductivity material and is prevented, thus the present invention is capable of reducing current leakage, enhancing durability of other elements, and reducing a non-radiative recombination generated by the threading dislocation, thereby minimizing degradation of luminosity.

In particular, the second conductivity type semiconductor layer 260 which is formed when a sloped surface exists caused by the second v-pit structure v2 formed on the active layer 250 has an effect of preventing current as a thin film having a low conductive semi-insulating characteristic forms on a portion of V-shaped distortion structure. Also, a carrier is easily injected from the second conductivity type semiconductor layer 260, which is on the active layer 250, to the V-shaped sloped surface so that it makes an injection of the carrier up to the lower part of the active layer 250 easy, thus, the effective light-emitting layer and the efficiency of the entire device can be increased.

On the other hand, the high-resistance semiconductor layer 230 has low conductivity and this improves the transverse current spreading, thus overall uniform light-emitting characteristics on light-emitting area and the reverse voltage characteristics can be improved.

On the other hand, this embodiment is given the first conductivity type semiconductor layer 220 and 240 is multiple layer structure but also it may be a single layer structure, in this case, the active layer 250 is formed directly on the high-resistance semiconductor layer 230, and a junction surface between the high-resistance semiconductor layer 230 and the active layer 250 is a plane structure.

On the other hand, as shown in FIG. 5, the second conductivity type semiconductor layer 260 may be a flat surface, but may have a v-pit structure on the surface thereof.

FIGS. 9a and 9b are graphs showing light-emitting characteristics according to a wavelength of a light-emitting device according to the second embodiment of the present invention (dotted line) in comparison with the conventional technique (solid line), wherein FIG. 9a shows a PL spectrum, and FIG. 9b shows an EL spectrum of the device.

Figure 9:
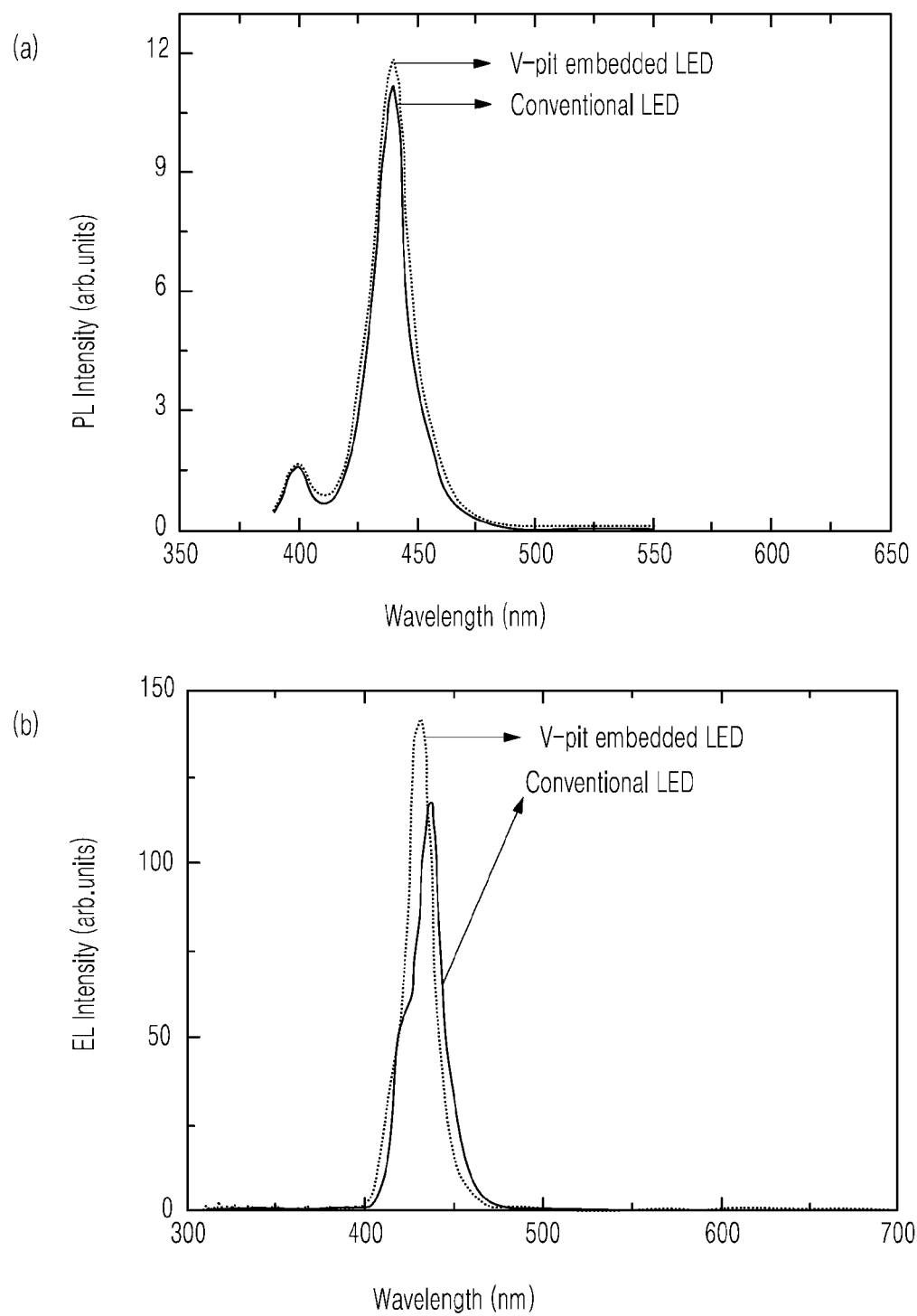
FIGS. 9a and 9b are graphs showing light-emitting characteristics according to a wavelength of a light-emitting device according to the second embodiment of the present invention in comparison with a conventional technique.

As illustrated in FIG. 9, the light-emitting device of the present invention was improved in comparison with conventional technique in the PL spectrum and the EL spectrum.

Although a preferred embodiment of the present invention has been described for illustrative purposes, those skilled in the art will appreciate that various modifications, additions and substitutions are possible, without departing from the scope and spirit of the invention as disclosed in the accompanying claims.

DESCRIPTION OF THE REFERENCE NUMERALS IN THE DRAWINGS 101, 201: threading dislocation, 110, 210: substrate
120, 220: lower first conductivity type semiconductor layer, 121, 221: electrode
130, 230: high-resistance semiconductor layer
140, 240: upper first conductivity type semiconductor layer
150, 250: active layer, 160, 260: second conductivity type semiconductor layer
170, 270: transparent electrode 171, 271: bonding electrode
v, v1, v2: v-pit structure

What is claimed is:

1. A nitride semiconductor light-emitting device, comprising:
   a substrate;
   a first conductivity type semiconductor layer formed on the substrate;
   a high-resistance semiconductor layer formed on the first conductivity type semiconductor layer;
   an active layer formed on the high-resistance semiconductor layer and having multiple quantum wells; and
   a second conductivity type semiconductor layer formed on the active layer,
   wherein the nitride semiconductor light-emitting device has
      a first V-shaped v-pit structure on a junction surface between the high-resistance semiconductor layer and the first conductivity type semiconductor layer, and
      a second V-shaped v-pit structure on a junction surface between the active layer and the second conductivity type semiconductor layer, the second V-shaped v-pit structure being formed such that the second conductivity type semiconductor layer extends to a lowest quantum well of the multiple quantum wells of the active layer through the second V-shaped v-pit structure,
   wherein a bottom surface of the active layer is flat with no v-pit structure,
   wherein the high-resistance semiconductor layer has a silicon impurity concentration of $10^{18}/cm^3$ or less, and
   wherein the high-resistance semiconductor layer has a magnesium impurity concentration equal to or greater than $10^{16}/cm^3$, but not more than the silicon impurity concentration.

2. The nitride semiconductor light-emitting device of claim 1, wherein a junction surface between the high-resistance semiconductor layer and the active layer has a plane or a gradual curved plane structure.

3. The nitride semiconductor light-emitting device of claim 1, wherein the high-resistance semiconductor layer has a thickness range of 10 nm to 1000 nm.

* * * * *